(12) United States Patent
An et al.

(10) Patent No.: US 9,543,250 B2
(45) Date of Patent: Jan. 10, 2017

(54) SEMICONDUCTOR DEVICES INCLUDING THROUGH-SILICON VIA

(71) Applicant: Samsung Electronics Co., Ltd., Suwon-si, Gyeonggi-do (KR)

(72) Inventors: Jin Ho An, Seoul (KR); Byung Lyul Park, Seoul (KR); Soyoung Lee, Suwon-si (KR); Gilheyun Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/729,264

(22) Filed: Jun. 3, 2015

(65) Prior Publication Data

US 2015/0270221 A1 Sep. 24, 2015

Related U.S. Application Data

(62) Division of application No. 14/094,963, filed on Dec. 3, 2013, now Pat. No. 9,076,849.

(30) Foreign Application Priority Data

Dec. 6, 2012 (KR) ........................ 10-2012-0140996

(51) Int. Cl.
*H01L 21/44* (2006.01)
*H01L 23/538* (2006.01)
*H01L 21/768* (2006.01)
*H01L 23/48* (2006.01)
*H01L 23/00* (2006.01)

(52) U.S. Cl.
CPC ..... *H01L 23/5384* (2013.01); *H01L 21/76877* (2013.01); *H01L 21/76885* (2013.01); *H01L 21/76898* (2013.01); *H01L 23/481* (2013.01); *H01L 24/09* (2013.01); *H01L 2224/0401* (2013.01); *H01L 2224/08146* (2013.01); *H01L 2224/13* (2013.01); *H01L 2224/16145* (2013.01);

(Continued)

(58) Field of Classification Search
CPC ..................................................... H01L 21/768
USPC ........................................................ 438/613
See application file for complete search history.

(56) References Cited

U.S. PATENT DOCUMENTS 7,199,043 B2  4/2007  Park
7,678,686 B2  3/2010  Park
(Continued)

FOREIGN PATENT DOCUMENTS

JP        2003282572 A    10/2003
KR     10-0525906 B1    11/2005
(Continued)

*Primary Examiner* — Caleb Henry
(74) *Attorney, Agent, or Firm* — Harness, Dickey & Pierce, P.L.C.

(57) ABSTRACT

Semiconductor devices, and methods of fabricating a semiconductor device, include forming a via hole through a first surface of a substrate, the via hole being spaced apart from a second surface facing the first surface, forming a first conductive pattern in the via hole, forming an insulating pad layer on the first surface of the substrate, the insulating pad having an opening exposing the first conductive pattern, performing a thermal treatment on the first conductive pattern to form a protrusion protruding from a top surface of the first conductive pattern toward the opening, and then, forming a second conductive pattern in the opening.

5 Claims, 17 Drawing Sheets

(52) U.S. Cl.
CPC .................. *H01L 2924/1305* (2013.01); *H01L 2924/13091* (2013.01); *H01L 2924/181* (2013.01)

(56) References Cited

U.S. PATENT DOCUMENTS

| | | | |
|---|---|---|---|
| 7,928,534 B2* | 4/2011 | Hsu | H01L 23/481 257/621 |
| 7,956,442 B2* | 6/2011 | Hsu | H01L 21/76898 257/621 |
| 8,076,234 B1 | 12/2011 | Park et al. | |
| 8,158,489 B2* | 4/2012 | Huang | H01L 21/6836 438/455 |
| 8,227,839 B2* | 7/2012 | West | H01L 21/76898 257/276 |
| 8,390,120 B2 | 3/2013 | Moon et al. | |
| 8,461,045 B2* | 6/2013 | Hsu | H01L 23/481 257/621 |
| 8,466,553 B2* | 6/2013 | Cheng | H01L 24/05 257/734 |
| 8,519,516 B1* | 8/2013 | Gandhi | H01L 21/7684 257/621 |
| 8,709,936 B2* | 4/2014 | Volant | H01L 21/76879 438/614 |
| 8,759,949 B2* | 6/2014 | Yu | H01L 21/6836 257/621 |
| 8,836,116 B2* | 9/2014 | Yang | B81C 1/0023 257/737 |
| 9,171,753 B2* | 10/2015 | Lee | H01L 21/02271 |
| 2003/0064587 A1* | 4/2003 | Han | H01L 21/02074 438/687 |
| 2004/0129344 A1* | 7/2004 | Arita | B23K 35/0222 148/23 |
| 2009/0212438 A1* | 8/2009 | Kreupl | H01L 21/76898 257/773 |
| 2010/0090319 A1* | 4/2010 | Hsu | H01L 23/481 257/621 |
| 2010/0140751 A1* | 6/2010 | Tay | H01L 21/76898 257/621 |
| 2010/0276787 A1* | 11/2010 | Yu | H01L 21/6836 257/621 |
| 2011/0095435 A1* | 4/2011 | Volant | H01L 21/76898 257/774 |
| 2011/0143535 A1 | 6/2011 | Pares | |
| 2011/0316168 A1* | 12/2011 | Moon | H01L 23/481 257/774 |
| 2012/0139127 A1* | 6/2012 | Beyne | H01L 21/764 257/774 |
| 2012/0181686 A1* | 7/2012 | Park | H01L 21/561 257/737 |
| 2012/0276733 A1* | 11/2012 | Saeki | H01L 21/76898 438/613 |
| 2012/0305095 A1 | 12/2012 | Zittrer | |
| 2012/0306095 A1* | 12/2012 | Han | H01L 25/0657 257/774 |
| 2013/0154107 A1* | 6/2013 | Kim | H01L 21/76898 257/774 |
| 2013/0264720 A1* | 10/2013 | Chun | H01L 23/481 257/774 |
| 2013/0285244 A1* | 10/2013 | Lin | H01L 21/7685 257/751 |
| 2013/0313687 A1* | 11/2013 | Bonkohara | H01L 21/76898 257/621 |
| 2014/0015136 A1* | 1/2014 | Gan | H01L 23/52 257/751 |
| 2014/0124954 A1* | 5/2014 | Farooq | H01L 21/76879 257/774 |
| 2014/0131871 A1* | 5/2014 | Tsai | H01L 23/49562 257/750 |
| 2014/0131887 A1* | 5/2014 | Lee | H01L 23/481 257/774 |
| 2014/0148007 A1* | 5/2014 | Kim | H01L 23/3135 438/667 |
| 2014/0151895 A1* | 6/2014 | West | H01L 21/76898 257/774 |
| 2014/0154880 A1* | 6/2014 | Brighton | H01L 21/76898 438/653 |
| 2014/0217603 A1* | 8/2014 | Moon | H01L 23/49827 257/774 |
| 2015/0035159 A1* | 2/2015 | Lin | H01L 23/481 257/762 |

FOREIGN PATENT DOCUMENTS

| | | |
|---|---|---|
| KR | 10-0606544 B1 | 8/2006 |
| KR | 10-0632622 B1 | 10/2006 |
| KR | 2007-0066426 A | 6/2007 |
| KR | 10-0778855 B1 | 11/2007 |
| KR | 10-1158730 B1 | 6/2012 |

\* cited by examiner

SEMICONDUCTOR DEVICES INCLUDING THROUGH-SILICON VIA

CROSS-REFERENCE TO RELATED APPLICATIONS

This U.S. non-provisional patent application is a divisional application of U.S. application Ser. No. 14/094,963, filed on Dec. 3, 2013, which claims the benefit of priority under 35 U.S.C. §119 to Korean Patent Application No. 10-2012-0140996, filed on Dec. 6, 2012, in the Korean Intellectual Property Office, the entire contents of each of which are herein incorporated by reference.

BACKGROUND

1. Field

Example embodiments of the inventive concepts relate to semiconductor devices and/or methods of fabricating the same, and in particular, to semiconductor devices with through-silicon vias and/or methods of fabricating the same.

2. Description of Related Art

There is a growing trend to fabricate lightweight, small-sized, high speed, multifunctional, high performance, and low-cost electronic systems. In response to such a trend, multi-chip stacked package techniques and/or system in package techniques have been proposed. In the multi-chip stacked package or the system in package, one or more semiconductor devices may perform one or more functions in a single semiconductor package. The multi-chip stacked package or the system in package may have a thicker thickness as compared to a single chip package but have a similar size to the single chip package in terms of a planar surface area or 'footprint'. Thus, the multi-chip stacked package or the system in package may be used in small electronic devices such as mobile devices with high performance requirements, for example, mobile phones, notebook computers, memory cards, and/or portable camcorders.

The multi-chip stacked package or the system in package may be realized using a through-silicon via (TSV) technology. A through-silicon via may affect performance of the semiconductor device.

SUMMARY

Example embodiments of the inventive concepts provide a semiconductor device with improved electric characteristics.

Other example embodiments of the inventive concepts provide a method of fabricating a semiconductor device with improved electric characteristics.

According to example embodiments of the inventive concepts, a semiconductor device may include a substrate having a first surface and a second surface facing each other, a through-silicon via provided in a via hole penetrating the substrate, an integrated circuit spaced apart from the through-silicon via, the integrated circuit being on the first surface of the substrate, a first pad connected to the through-silicon via, the first pad being on the first surface of the substrate, and a second pad connected to the through-silicon via, the second pad being on the second surface of the substrate. The through-silicon via may include a first conductive pattern filling the via hole and a protrusion extending from the first conductive pattern into the first pad.

In example embodiments, the first pad may be in contact with the protrusion.

In example embodiments, the first pad may include a recess region extending from a bottom surface of the first pad toward a top surface of the first pad, and the protrusion may be in contact with the recess region of the first pad.

In example embodiments, a width of the recess region decreases with increasing distance from the bottom surface of the first pad.

In example embodiments, the device may further include an interlayered dielectric layer on the first surface of the substrate to cover the integrated circuit. The via hole penetrates the interlayered dielectric layer, and the first pad may be on the interlayered dielectric layer.

In example embodiments, the recess region may extend to the top surface of the first pad, and the protrusion penetrates the first pad.

In example embodiments, the protrusion has a top surface coplanar with the top surface of the first pad.

In example embodiments, the protrusion has a top surface lower than the top surface of the first pad, and the protrusion may be in contact with the recess region.

According to example embodiments of the inventive concepts, a method of fabricating a semiconductor device includes forming a via hole through a first surface of a substrate, the via hole being spaced apart from a second surface facing the first surface, forming a first conductive pattern in the via hole, forming an insulating pad layer on the first surface of the substrate, the insulating pad layer having an opening exposing the first conductive pattern, performing a thermal treatment on the first conductive pattern to form a protrusion protruding from a top surface of the first conductive pattern toward the opening, and forming a second conductive pattern in the opening.

In example embodiments, the thermal treatment may be performed at a temperature of about 300° C.-500° C., or at a temperature of about 400° C. or more.

In example embodiments, the forming of a second conductive pattern may include forming a second conductive layer in the opening, and planarizing the second conductive layer to expose the insulating pad layer. The second conductive pattern may have a top surface coplanar with a top surface of the insulating pad layer.

In example embodiments, the thermal treatment may be performed in such a way that the protrusion has a top surface higher than the top surface of the insulating pad layer.

In example embodiments, the planarizing the second conductive layer may be performed in such a way that the protrusion has a top surface coplanar with the top surface of the insulating pad layer.

In example embodiments, the method may further include forming an integrated circuit on the first surface of the substrate, the integrated circuit being spaced apart from the via hole, before the forming a via hole, and then, forming an interlayered dielectric layer to cover the integrated circuit. The via hole may be formed to penetrate the interlayered dielectric layer, and the insulating pad layer may be formed on the interlayered dielectric layer.

In example embodiments, the method may further include etching the second surface of the substrate to expose a bottom surface of the first conductive pattern, and forming a pad on the second surface of the substrate, the pad being connected to the bottom surface of the first conductive pattern.

According to example embodiments, a method of fabricating a semiconductor device, includes forming a first conductive pattern in a via hole, the via hole penetrating a substrate, forming an insulating pad layer over the substrate, the insulating pad layer exposing the first conductive pattern, exerting a compressive stress on the first conductive pattern exposed by the insulating pad layer to form a protrusion protruding from the first conductive pattern, and forming a second conductive pattern contacting the protrusion.

The method may further include forming at least one interlayered dielectric layer on the substrate, prior to the forming a first conductive pattern, wherein the via hole penetrates the at least one interlayered dielectric layer, and the exerting a compressive stress may include performing a thermal treatment process so as to cause metallic elements in the first conductive pattern to extrude above the at least one interlayered dielectric layer.

The method may further include performing a preliminary thermal treatment process on the first conductive pattern so as to induce growth of metal grains in the first conductive pattern, prior to the forming an insulating pad layer. The thermal treatment process may be performed at a higher temperature than the preliminary thermal treatment process.

The forming a second conductive pattern may include forming a second conductive layer over the insulating pad layer and the protrusion, a bottom surface of the second conductive layer having a recess with a profile corresponding to a profile of the protrusion, and planarizing the second conductive layer to form the second conductive pattern exposing an upper surface of the insulating pad layer.

The thermal treatment process may cause the metallic elements in the first conductive pattern to extrude above the insulating pad layer, and the planarizing the second conductive layer to form the second conductive pattern may include forming the second conductive pattern so as to expose an upper surface of the protrusion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
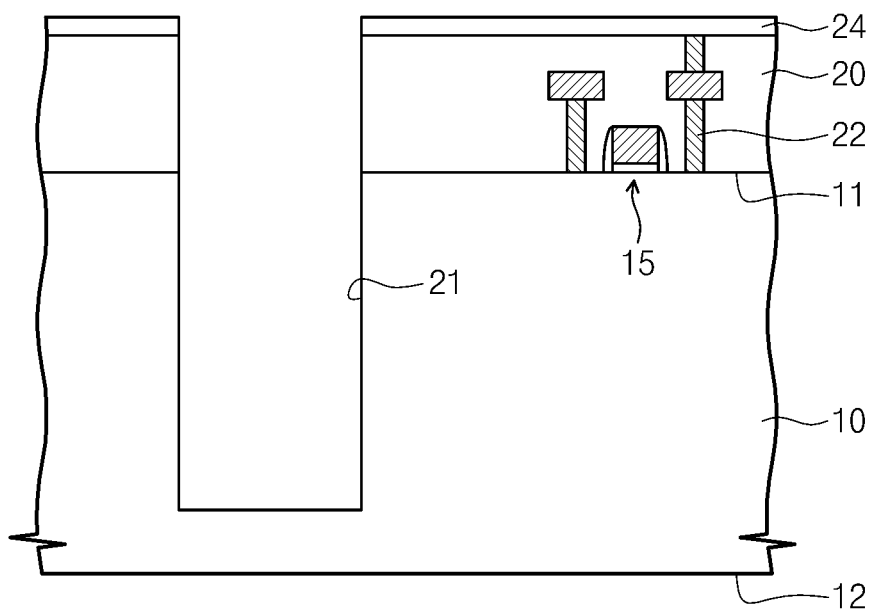
FIGS. 1 through 9 are sectional views illustrating a method of fabricating a semiconductor device, according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being ibe various elements, these elements should not be limited by these terms. These terms are only used to distinguish one element from another. For eIn contrast, if an element is referred to as being ed to as being ibe various elements, these elements shouldent, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms be the relati "the" are intended to include the plural forms as well, unless the context clearly indicates otherwise. It will be further understood that the terms e of describing particng,r embodiments only and is not intended to be limiting of example embodiments. Afeatures, integers, steps, operations, elements and/or components, but do not preclude the presence or addition of one or more other features, integers, steps, operations, elements, components and/or groups thereof.

Spatially relative terms (e.g., at the terms tures, integers, steps, operations, elements, components and/or groups thereof.fy the presence of stated features, integers, steps, operations, elements and/or componen mor feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A method of fabricating a semiconductor device according to an example embodiment of the inventive concepts will be described with reference to sectional views of FIGS. 1 through 9.

Referring to FIG. 1, provided is a substrate 10 having a first surface 11 and a second surface 12 facing each other. In example embodiments, the substrate 10 may be, for example, a p-type silicon wafer.

An integrated circuit 15 may be formed on the first surface 11 of the substrate 10. The integrated circuit 15 may include a switching element, a capacitor, a resistor, or a vertical memory cell. The switching element may be, for example, a diode, an NMOS transistor, a PMOS transistor, or a bipolar transistor. The vertical memory cell may include a vertical pillar vertically extending from the substrate 10 and a memory element coupled to the vertical pillar.

A first interlayered dielectric layer 20 may be formed on the first surface 11 of the substrate 10 to cover the integrated circuit 15. The first interlayered dielectric layer 20 may include a silicon oxide layer. A first contact 22 may be formed through the first interlayered dielectric layer 20. The first contact 22 may be formed of, for example, aluminum or tungsten. The first contact 22 may be connected to a doped region of the integrated circuit 15 (e.g., source/drain regions of MOS transistor). An etch stop layer 24 may be formed on the first interlayered dielectric layer 20. The etch stop layer 24 may include a silicon nitride layer.

A mask pattern (not shown) may be formed on the etch stop layer 24. The mask pattern (not shown) may be used to etch the etch stop layer 24, the first interlayered dielectric layer 20, and the substrate 10 and to form a via hole 21. The via hole 21 may be formed by a drilling process, a Bosch etching process, or a steady-state etching process. The via hole 21 may be formed to penetrate the etch stop layer 24 and the first interlayered dielectric layer 20 and extend from the first surface 11 of the substrate 10 toward the second surface 12. The via hole 21 may be too shallow to penetrate the substrate 10. The via hole 21 may be formed to have a depth of about 50 µm or more. However, the depth of the via hole 21 may be changed depending on a design rule or a specific device requirement.

Figure 2:
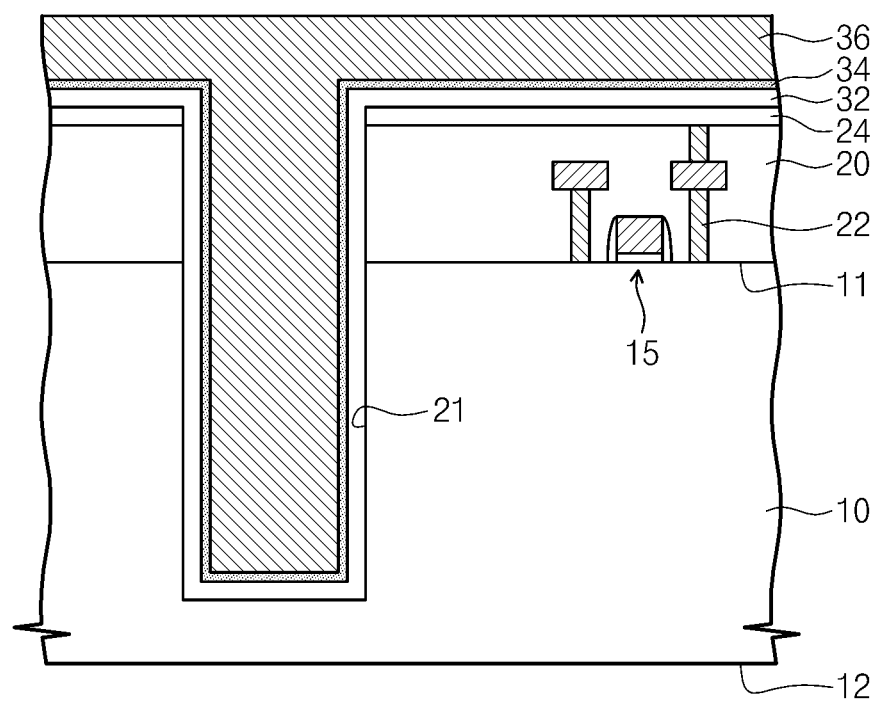

Referring to FIG. 2, a via-hole insulating layer 32 may be formed in the via hole 21. The via-hole insulating layer 32 may be formed by depositing an insulating material, such as, a silicon oxide layer or a silicon nitride layer. The via-hole insulating layer 32 may be conformally deposited on an inner surface of the via hole 21. The via-hole insulating layer 32 may extend over the first interlayered dielectric layer 20. The via-hole insulating layer 32 may be formed using, for example, an atomic layer deposition or a chemical vapor deposition.

A first barrier layer 34 may be formed on the via-hole insulating layer 32. The first barrier layer 34 may be formed to cover the inner surface of the via hole 21 and extend over the first surface 11. The first barrier layer 34 may include titanium, titanium nitride, tantalum, tantalum nitride, ruthenium, cobalt, manganese, tungsten nitride, nickel, nickel boride, or a double layer of titanium/titanium nitride. The first barrier layer 34 may be formed by a sputtering process. The first barrier layer 34 may be formed at a temperature of about 375° C. The first barrier layer 34 may be configured to prevent metallic elements in a first conductive layer 36, which will be formed in a subsequent process, from diffusing into the substrate 10.

The first conductive layer 36 may be formed on the first barrier layer 34 to fill the via hole 21. The first conductive layer 36 may extend over the first surface 11. The first conductive layer 36 may be formed using an electroplating process, an electroless plating process, or a selective deposition process. The electroplating process may include forming a seed layer (not shown) on the inner surface of the via hole 21 provided with the first barrier layer 34, and then, plating the seed layer with a conductive layer. In example embodiments, the first conductive layer 36 may be formed at room temperature (or, alternatively, about 21° C.). The seed layer may be a copper layer, which may be formed by a sputtering process. The conductive layer 34 may be a metal layer. For example, the metal layer may include silver, gold, copper, tungsten, or indium. In example embodiments, the electroplating process may be performed by dipping the substrate into electrolytic solution containing $CuSO_4$, $H_2SO_4$, and Cl.

After the formation of the first barrier layer 34 and the first conductive layer 36, a first thermal treatment process may be performed. The first thermal treatment process may be performed at a temperature of about 100-500° C. The first thermal treatment process may be performed to induce growth of metal grains in the first conductive layer 36.

Figure 3:
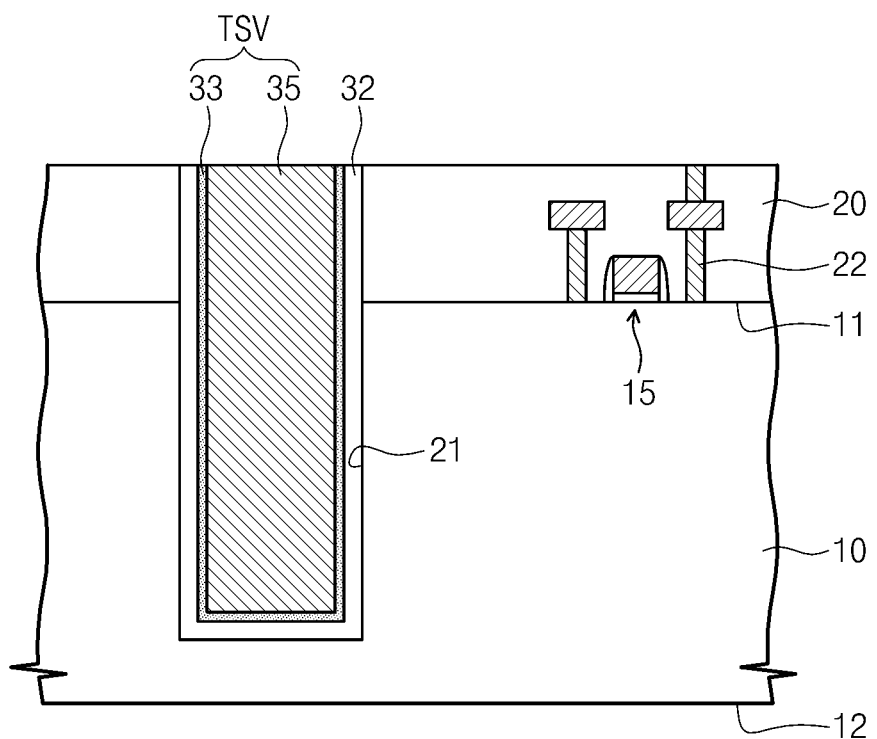

Referring to FIG. 3, the first conductive layer 36 may be planarized to expose the etch stop layer 24. Here, the first barrier layer 34 and the via-hole insulating layer 32 may be removed from a top surface of the etch stop layer 24. As the result of the planarization, a through-silicon via (TSV) with a first barrier pattern 33 and a first conductive pattern 35 may be formed in the via hole 21. Thereafter, the etch stop layer 24 may be removed. In example embodiments, a thermal treatment process may be additionally performed. Thermal treatment process may be performed at a temperature of about 100-500° C.

Figure 4:
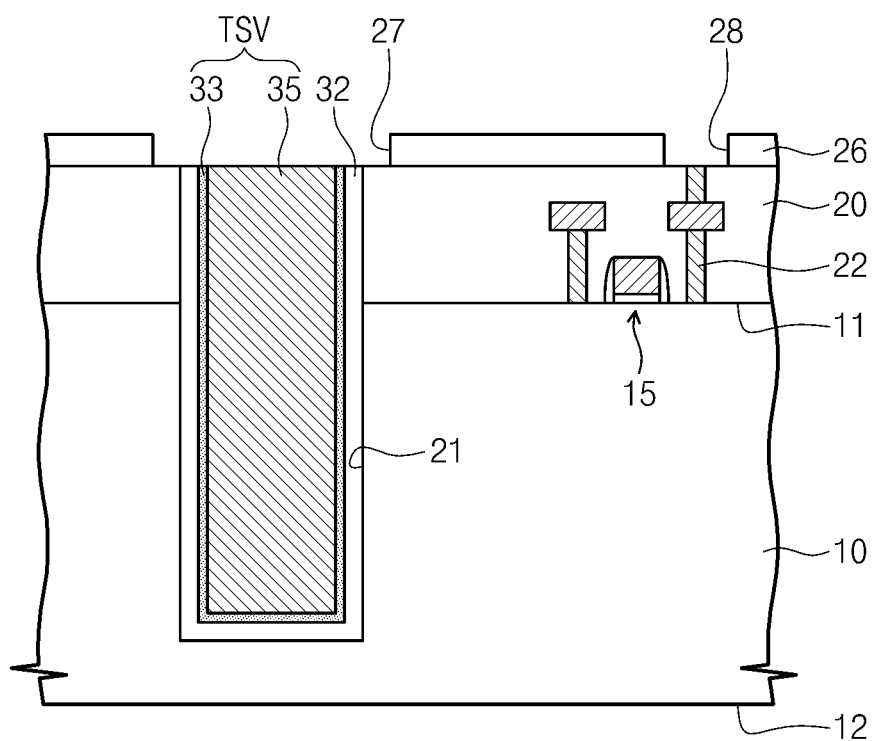

Referring to FIG. 4, an insulating pad layer 26 may be formed on the first interlayered dielectric layer 20. The insulating pad layer 26 may be formed to have first and second openings 27 and 28 exposing the through-silicon via (TSV) and the first contact 22, respectively. Widths of the first and second openings 27 and 28 may be greater than widths of the through-silicon via (TSV) and the first contact 22, respectively. In example embodiments, the insulating pad layer 26 may include a silicon oxide layer. In other example embodiments, the insulating pad layer 26 may include SiCN, SiCOH, and SiON layers that are sequentially stacked on the first interlayered dielectric layer 20.

Figure 5:
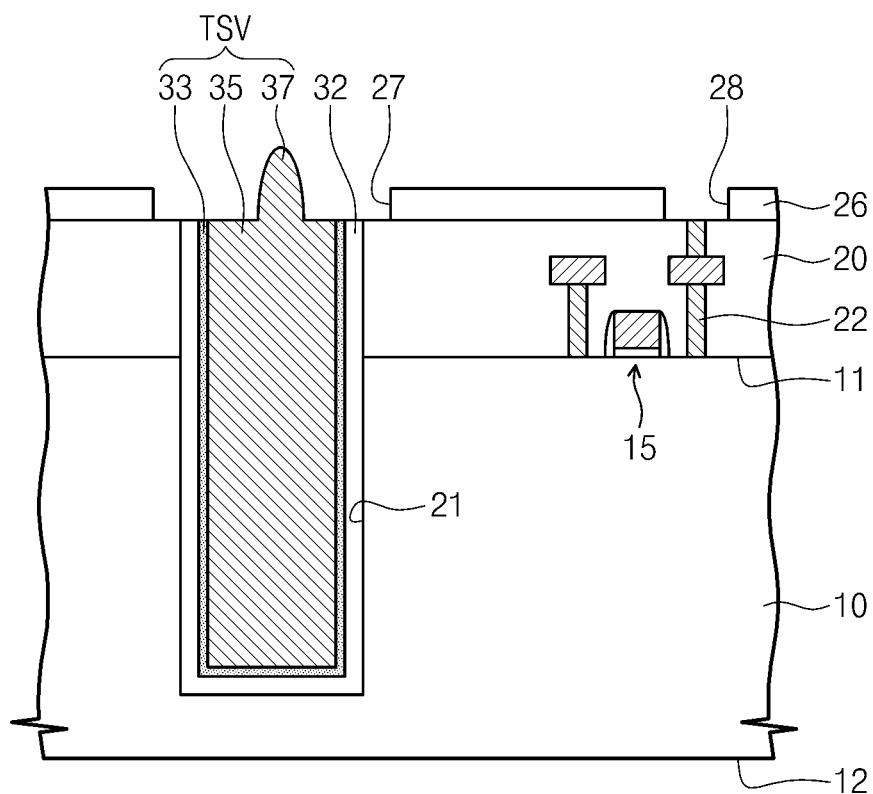

Referring to FIG. 5, a second thermal treatment process may be performed at a temperature that is higher than that of the first thermal treatment process. For example, the second thermal treatment process may be performed at a temperature of about 300-500° C. In the case where the first conductive pattern 35 is formed of a different material (e.g., copper) from the substrate (e.g., made of silicon), a difference in thermal expansion coefficient therebetween may produce a compressive stress to be exerted to the first conductive pattern 35. Accordingly, metallic elements of the first conductive layer 36 may expand and extrude. For example, as the result of the extrusion of the first conductive pattern 35, a protrusion 37 may be formed in the first opening 27. The protrusion 37 may be protruded from a top of the first conductive pattern 35 into the first opening 27, and thus, the protrusion 37 may have a top surface that is higher than that of the insulating pad layer 26.

Figure 6:
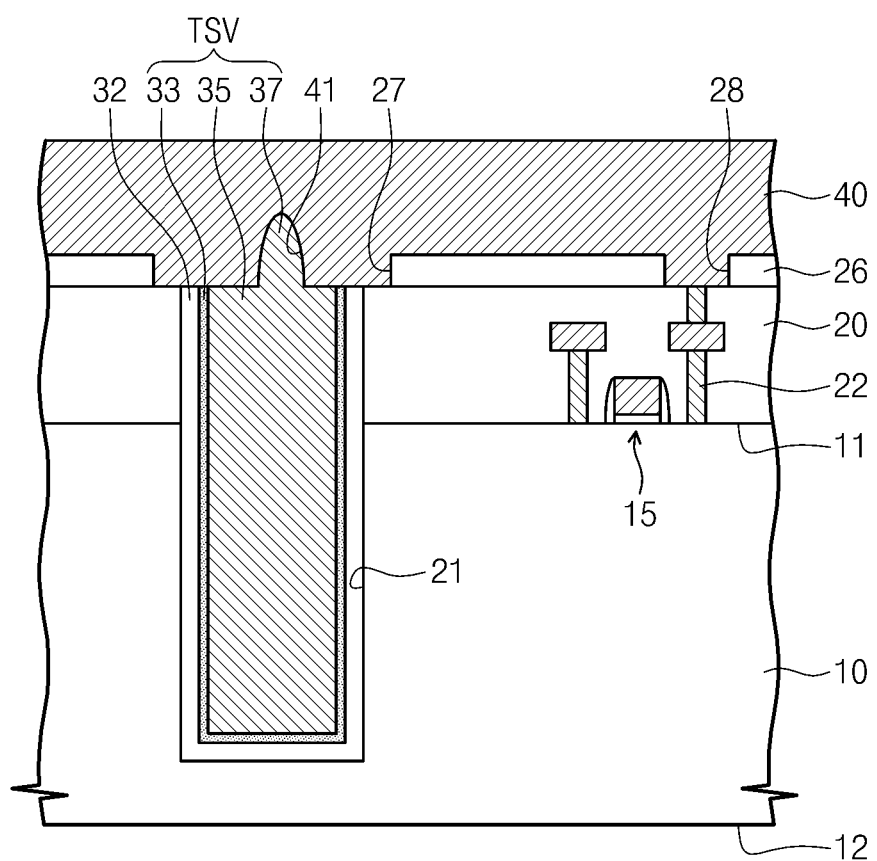

Referring to FIG. 6, a second conductive layer 40 may be formed on the insulating pad layer 26 to fill the first and second openings 27 and 28. The second conductive layer 40 may be formed using a process similar to that for the first conductive layer 36. Before the formation of the second conductive layer 40, a second barrier layer (not shown) and a seed layer (not shown) may be additionally formed. In the first opening 27, the second conductive layer 40 may have a recess region 41 that is a concave portion formed from a bottom surface thereof toward a top surface thereof. The recess region 41 may be formed to have a profile corresponding to that of the protrusion 37. The protrusion 37 may be in contact with the recess region 41 of the second conductive layer 40.

Figure 7:
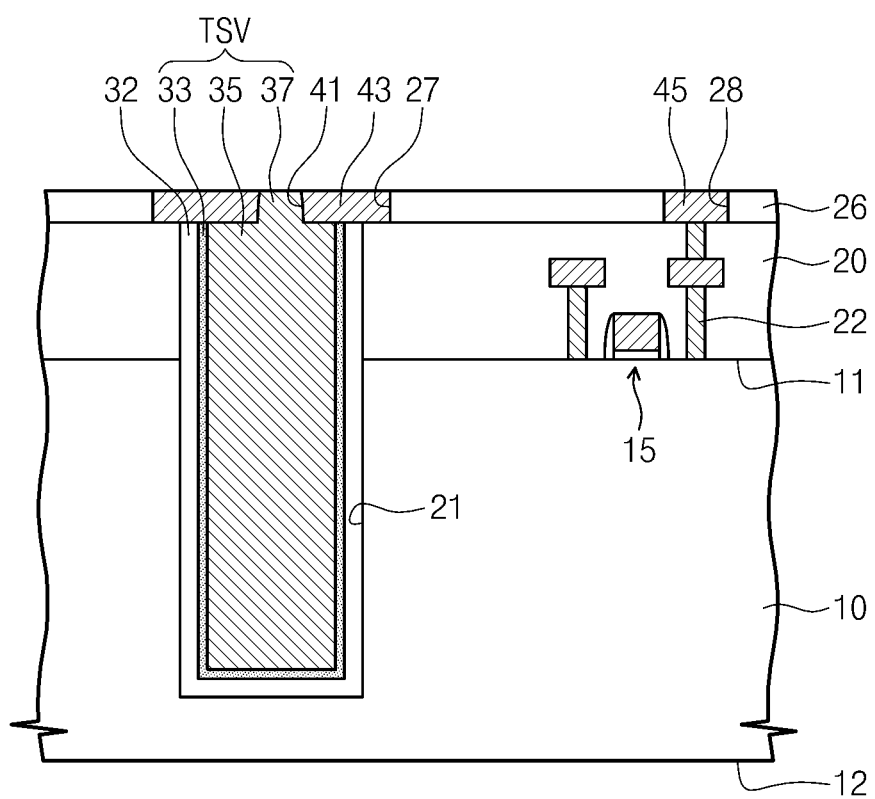

Referring to FIG. 7, the second conductive layer 40 may be planarized to form a second conductive pattern exposing the insulating pad layer 26. The second barrier layer (not shown) may be planarized to form a second barrier pattern. As the result of the planarization, a first pad 43 may be formed in the first opening 27 and a second pad 45 may be formed in the second opening 28. The first pad 43 may be in contact with the through-silicon via (TSV), and the second pad 45 may be in contact with the first contact 22. Each of the first and second pads 43 and 45 may include the second conductive pattern and the second barrier pattern (not shown). The first and second pads 43 and 45 may have top surfaces that are coplanar with that of the insulating pad layer 26.

In example embodiments, the protrusion 37 may be planarized during the planarization process. Accordingly, the protrusion 37 may have the top surface that is coplanar with that of the first pad 43. Further, the recess region 41 and the protrusion 37 may be exposed through a top surface of the first pad 43.

Figure 8:
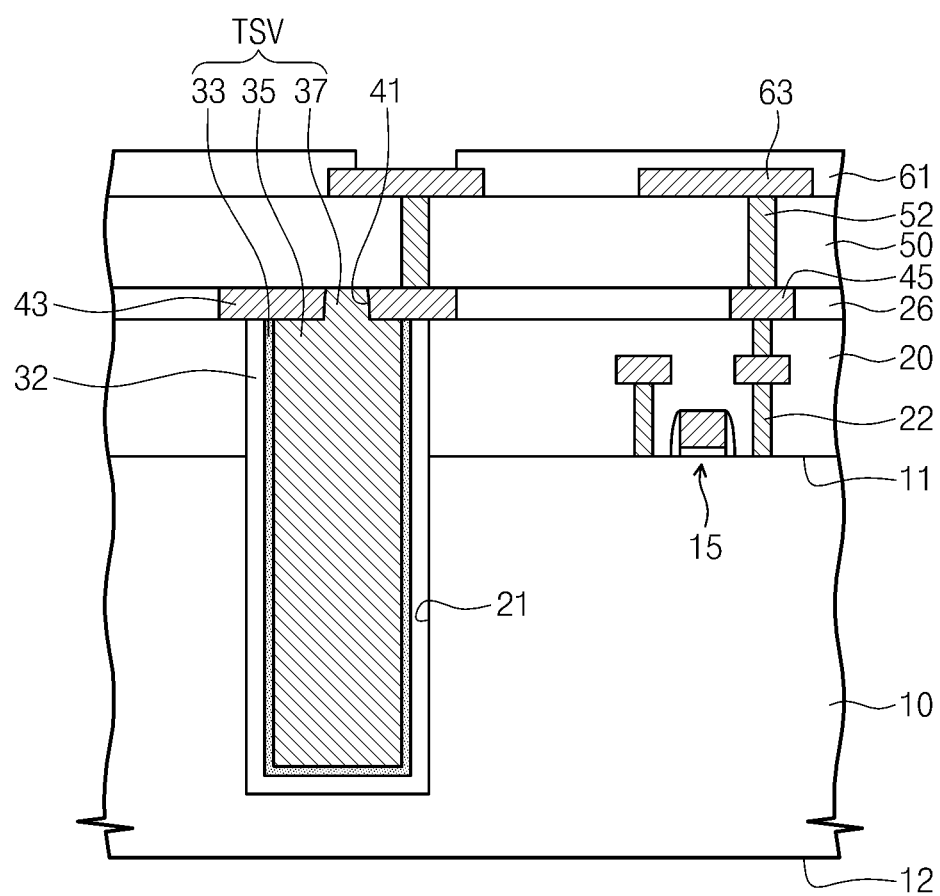

Referring to FIG. 8, a second interlayered dielectric layer 50 may be formed on the insulating pad layer 26. The second interlayered dielectric layer 50 may include a silicon oxide layer. The second interlayered dielectric layer 50 may be formed by a CVD process. For example, the second interlayered dielectric layer 50 may be a TEOS oxide layer. The second interlayered dielectric layer 50 may be formed at a temperature of about 400° C.

A second contact 52 may be formed in the second interlayered dielectric layer 50. The formation of the second contact 52 may include patterning the second interlayered dielectric layer 50 to form openings exposing the first and second pads 43 and 45, and then, filling the opening with aluminum or tungsten.

A third pad 63 may be formed on the second interlayered dielectric layer 50. The third pad 63 may be connected to the second contact 52. Thereafter, a first passivation layer 61 may be formed to cover the second interlayered dielectric layer 50 and expose a portion of the third pad 63. The first passivation layer 61 may be formed of a material capable of protecting the integrated circuit 15 against external pollution and environmental stress. For example, the first passivation layer 61 may include at least one of silicon oxide or silicon nitride. The third pad 63 may be formed of aluminum or copper.

Figure 9:
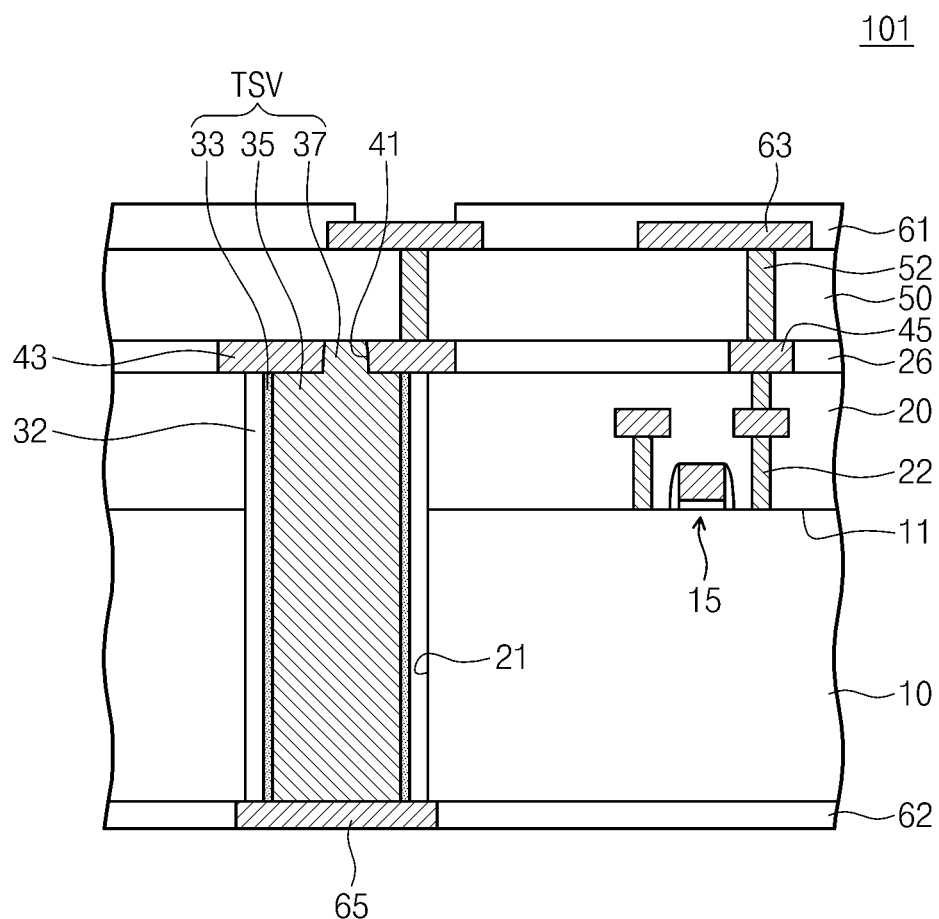

Referring to FIG. 9, the second surface 12 of the substrate 10 may be polished or ground. Accordingly, the through-silicon via (TSV) may be exposed through the ground second surface 12. The grinding process will be described in more detail below.

Firstly, a carrier (not shown) may be attached on the first passivation layer 61 of the substrate 10 using an adhesive layer (not shown). The carrier may be configured to relieve a mechanical stress, which may be exerted to the substrate 10 in the grinding process, and to prevent a thinned substrate 10 from being deformed after the grinding process. In example embodiments, the carrier may include a glass substrate or a resin substrate. The adhesive layer may include an ultraviolet adhesive or a thermoplastic adhesive. Next, the second surface 12 of the substrate 10 may be polished to expose the via-hole insulating layer 32. The polishing of the substrate 10 may be performed by, for example, a grinding process, in which each or at least one of a CMP process, an etch-back process, and a spin-etch process is used.

Thereafter, the substrate 10 may be selectively etched in such a way that a bottom portion of the through-silicon via (TSV) is protruded from the second surface 12 of the substrate 10. The selective etching of the substrate 10 may be performed by a wet etching process or a dry etching process, in which the substrate 10 is etched with a higher etch rate than the via-hole insulating layer 32. For example, if the via-hole insulating layer 32 is a silicon oxide layer, $SF_6$ etching gas may be used to etch selectively the substrate 10.

A second passivation layer 62 may be formed on the polished surface of the second surface 12. An etching process may be performed to remove partially the second passivation layer 62 and the via-hole insulating layer 32 and expose the through-silicon via (TSV). A fourth pad 65 may be formed on the second passivation layer 62 and be connected to the through-silicon via (TSV). The second passivation layer 62 may include at least one of silicon oxide or silicon nitride. The fourth pad 65 may be formed of, for example, copper.

Hereinafter, the semiconductor device according to an example embodiment of the inventive concepts will be described with reference to FIG. 9.

Referring to FIG. 9, a semiconductor device 101 may include the through-silicon via (TSV) penetrating the substrate 10.

The substrate 10 may have the first surface 11 and the second surface 12 facing each other. The substrate 10 may be, for example, a p-type silicon wafer. The integrated circuit 15 may be formed or integrated on the first surface 11 of the substrate 10. The integrated circuit 15 may include a switching element, a capacitor, a resistor, or a vertical memory cell. The switching element may be, for example, a diode, an NMOS transistor, a PMOS transistor, or a bipolar transistor. The vertical memory cell may include a vertical pillar vertically extending from the substrate 10 and a memory element coupled to the vertical pillar.

The first interlayered dielectric layer 20 may be formed on the first surface 11 of the substrate 10 to cover the integrated circuit 15. The first interlayered dielectric layer 20 may include a silicon oxide layer. The first contact 22 may penetrate the first interlayered dielectric layer 20. The first contact 22 may be formed of, for example, aluminum or tungsten. The first contact 22 may be connected to a doped region of the integrated circuit 15 (e.g., source/drain regions of MOS transistor).

The through-silicon via (TSV) may be formed in the via hole 21 that is formed to penetrate the substrate 10 and the first interlayered dielectric layer 20. The via-hole insulating layer 32 may be provided between sidewalls of the through-silicon via (TSV) and the via hole 21. The via-hole insulating layer 32 may include or be formed of a silicon oxide layer or a silicon nitride layer. In example embodiments, the through-silicon via (TSV) may be exposed through both of the first and second surfaces 11 and 12 of the substrate 10. The through-silicon via (TSV) may include the first barrier pattern 33 and the first conductive pattern 35. The through-silicon via (TSV) may further include the protrusion 37 upward protruding from the top surface of the first conductive pattern 35. The first conductive pattern 35 may include or be formed of a metal layer. The metal layer may include silver, gold, copper, tungsten, or indium. The first barrier pattern 33 may be provided between the via-hole insulating layer 32 and the first conductive pattern 35. The first barrier pattern 33 may include titanium, titanium nitride, tantalum, tantalum nitride, ruthenium, cobalt, manganese, tungsten nitride, nickel, nickel boride, or a double layer of titanium/titanium nitride.

The insulating pad layer 26 may be provided on the first interlayered dielectric layer 20. The insulating pad layer 26 may be formed to expose the through-silicon via (TSV) and the first contact 22.

The first pad 43 and the second pad 45 may be provided on the first interlayered dielectric layer 20 and be electrically connected to the through-silicon via (TSV) and the first contact 22, respectively. Each or all of the first pad 43 and the second pad 45 may include the second conductive pattern and the second barrier pattern. The second conductive pattern may be a metal layer. The metal layer may include silver, gold, copper, tungsten, or indium. The second barrier pattern may include titanium, titanium nitride, tantalum, tantalum nitride, ruthenium, cobalt, manganese, tungsten nitride, nickel, nickel boride, or a double layer of titanium/titanium nitride. In example embodiments, the first pad 43 may have the recess region 41 extending from a bottom surface thereof to a top surface thereof. The recess region 41 may have a shape corresponding to that of the protrusion 37. A width of the recess region 41 may decrease with increasing distance from the bottom surface of the first pad 43. The protrusion 37 may extend from the first conductive pattern 35 into the first pad 43. The protrusion 37 may be in contact with the recess region 41 of the first pad 43. For example, the protrusion 37 may have a top surface that is coplanar with that of the first pad 43. The protrusion 37 may penetrate the first pad 43 and be exposed through the top surface of the first pad 43.

The second interlayered dielectric layer 50 may be provided on the insulating pad layer 26. The second interlayered dielectric layer 50 may include a silicon oxide layer. The second contacts 52 may be formed in the second interlayered dielectric layer 50. The second contacts 52 may be connected to the first and second pads 43 and 45, respectively.

The third pad 63 may be formed on the second interlayered dielectric layer 50. The third pad 63 may be connected to the second contact 52. The first passivation layer 61 may be formed to cover the second interlayered dielectric layer 50 and expose a portion of the third pad 63. The first passivation layer 61 may be formed of a material capable of protecting the integrated circuit 15 against external pollution and environmental stress. For example, the first passivation layer 61 may include at least one of silicon oxide or silicon nitride. The third pad 63 may be formed of aluminum or copper.

The second passivation layer 62 may be formed on the second surface 12 of the substrate 10. The second passivation layer 62 may be formed to expose the through-silicon via TSV. The fourth pad 65 may be formed on the second passivation layer 62 and be connected to the through-silicon via (TSV). The second passivation layer 62 may include or be formed of at least one of silicon oxide or silicon nitride. The fourth pad 65 may be formed of, for example, copper.

A semiconductor device according to an example embodiment of the inventive concepts will be described with reference to a sectional view of FIG. 10. For the sake of brevity, the elements and features of this example that are similar to those previously shown and described will not be described in much further detail.

Figure 10:
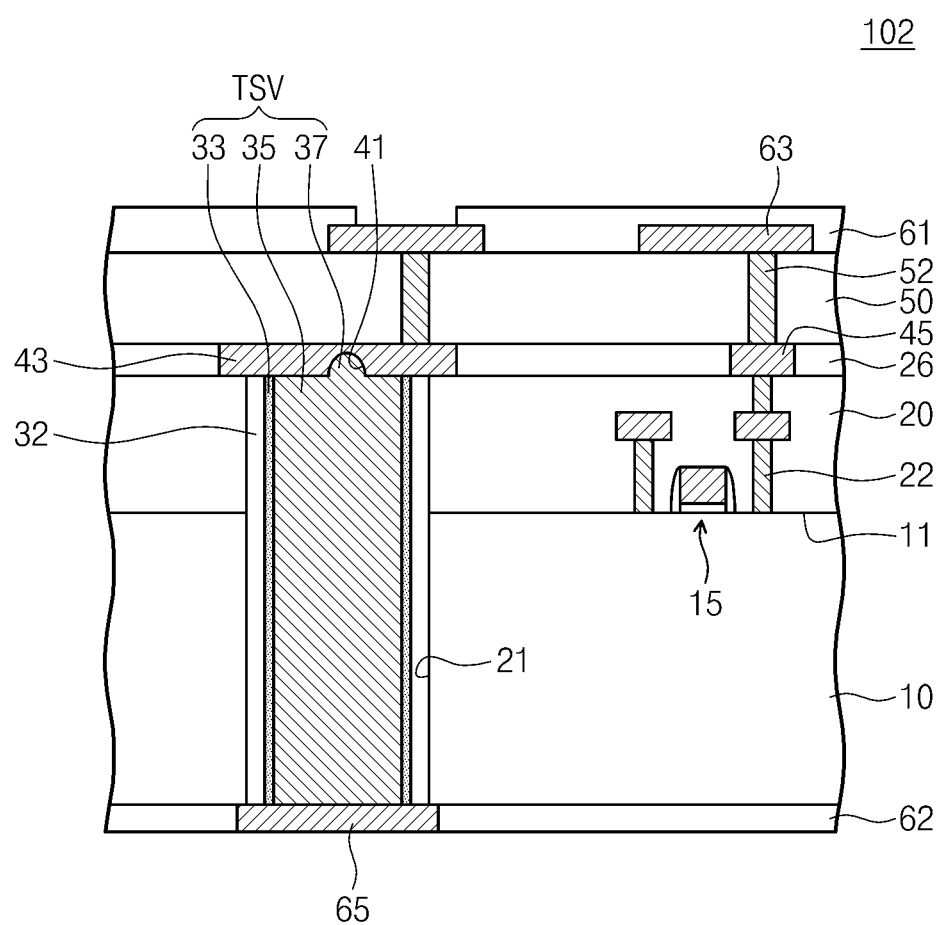
FIG. 10 is a sectional view of a semiconductor device, according to an example embodiment of the inventive concepts.

Referring to FIG. 10, the protrusion 37 may have a top surface that is lower than that of the first pad 43 and is in contact with the recess region 41. The protrusion 37 may be formed not to penetrate the first pad 43.

A semiconductor device according to another example embodiment of the inventive concepts will be described with reference to a sectional view of FIG. 11. For the sake of brevity, the elements and features of this example that are similar to those previously shown and described will not be described in much further detail.

Figure 11:
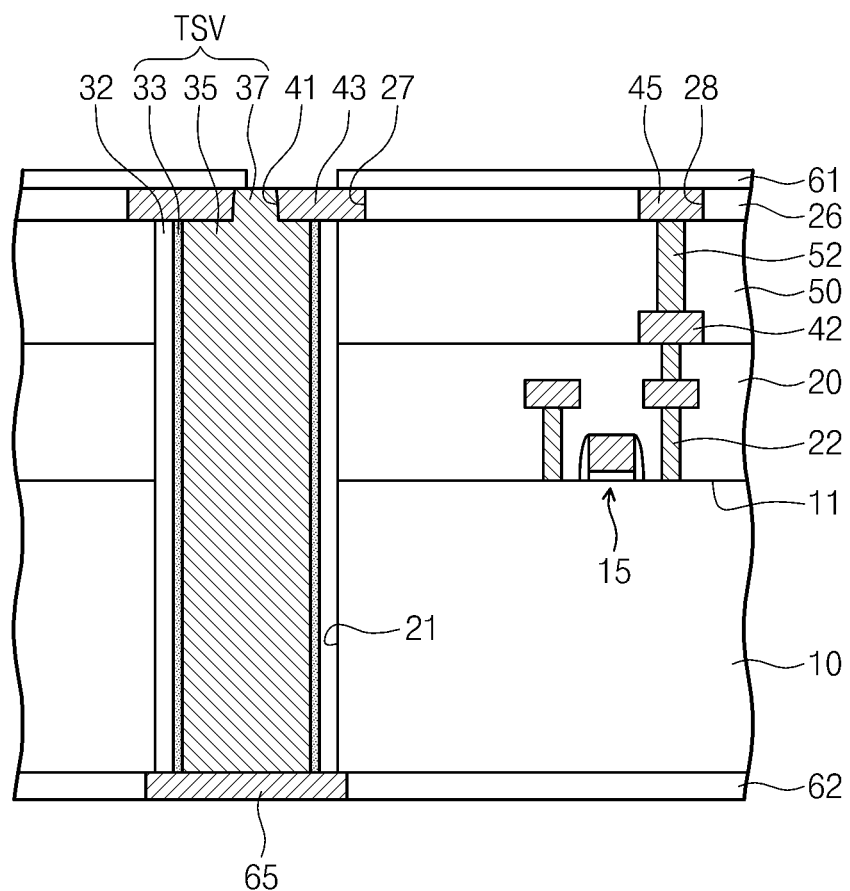
FIG. 11 is a sectional view of a semiconductor device, according to another example embodiment of the inventive concepts.

Referring to FIG. 11, the first interlayered dielectric layer 20 may be formed on the first surface 11 of the substrate 10 to cover the integrated circuit 15. The first interlayered dielectric layer 20 may include a silicon oxide layer.

The first contact 22 may be electrically connected to the integrated circuit 15 through the first interlayered dielectric layer 20. A first pad 42 may be formed on the first interlayered dielectric layer 20. The first pad 42 may be connected to the first contact 22. The second interlayered dielectric layer 50 may be formed to cover the first interlayered dielectric layer 20. The second interlayered dielectric layer 50 may include a silicon oxide layer. The second contact 52 may be electrically connected to the first pad 42 through the second interlayered dielectric layer 50.

The via hole 21 of the semiconductor device 103 may be formed to penetrate the first and third interlayered dielectric layers 20 and 50. The via hole 21 may extend from a top surface of the second interlayered dielectric layer 50 toward the substrate 10.

The through-silicon via (TSV) may be formed to fill the via hole 21. The through-silicon via (TSV) may be exposed through the top surface of the second interlayered dielectric layer 50. The through-silicon via (TSV) may extend to the top surface of the second interlayered dielectric layer 50 that is located opposite the first interlayered dielectric layer 20. The via-hole insulating layer 32 may be interposed between the through-silicon via (TSV) and the via hole 21.

The second and third pads 43 and 45 may be formed on the second interlayered dielectric layer 50. The second pad 43 may be connected to the through-silicon via (TSV). The third pad 45 may be connected to the second contact 52. The second and third pads 43 and 45 may have structures similar to those in the previous example embodiments. The first passivation layer 61 may be formed to cover the second interlayered dielectric layer 50 and expose at least a portion of the second and third pads 43 and 45.

The second passivation layer 62 may be formed on the second surface 12 of the substrate 10. The fourth pad 65 may be formed on the second passivation layer 62 and be connected to the through-silicon via (TSV). The second passivation layer 62 may include at least one of silicon oxide or silicon nitride. The fourth pad 65 may be formed of, for example, copper.

The semiconductor device shown in of FIG. 11 may be fabricated using a process similar to that for the semiconductor device formed in the method shown in FIGS. 1-9. In the following description, for concise description, technical features in a fabricating method that are different from that for the semiconductor device shown in FIGS. 1-9 will be mainly described below.

As shown in FIG. 11, the formation of the via hole 21 of a semiconductor device 103 may be performed after forming the second interlayered dielectric layer 50 on the first interlayered dielectric layer 20, unlike the method of the previous example embodiments.

Thereafter, the second and third pads 43 and 45 may be formed on the second interlayered dielectric layer 50. The first passivation layer 61 may be formed to cover the second interlayered dielectric layer 50 and expose at least a portion of the second and third pads 43 and 45. The first passivation layer 61 may include or be formed of at least one of silicon oxide or silicon nitride.

The second passivation layer 62 may be formed on the second surface 12 of the substrate 10. The fourth pad 65 may be formed on the second passivation layer 62 and be connected to the through-silicon via (TSV). The second passivation layer 62 may include or be formed of at least one of silicon oxide or silicon nitride. The fourth pad 65 may be formed of, for example, copper.

In general, after the formation of the through-silicon via and the interlayered dielectric layer thereon, a metal expansion in the through-silicon via (TSV) may occur as the result of a thermal budget. The metal expansion may lead to various technical problems, related to connectivity between the through-silicon via and an interconnection line thereon. For example, reliability issue, such as an increase in contact resistance, may occur. By contrast, according to example embodiments of the inventive concepts, the protrusion may be formed and then removed, after the through-silicon via (TSV), and thus, it is possible to reduce technical problems related to the protrusion of the through-silicon via.

According to example embodiments of the inventive concepts, the second thermal treatment process may be performed after the formation of the insulating pad layer 26, and thus, it is possible to suppress characteristics of the integrated circuit from being changed. In other words, the insulating pad layer 26 makes it possible to reduce a change in threshold voltage, Vth, of transistors constituting the integrated circuit, which may be caused by a thermal budget in the second thermal treatment process. By contrast, if the second thermal treatment process is performed before the formation of the insulating pad layer 26, the transistors may suffer from a large change in threshold voltage thereof.

Figure 12:
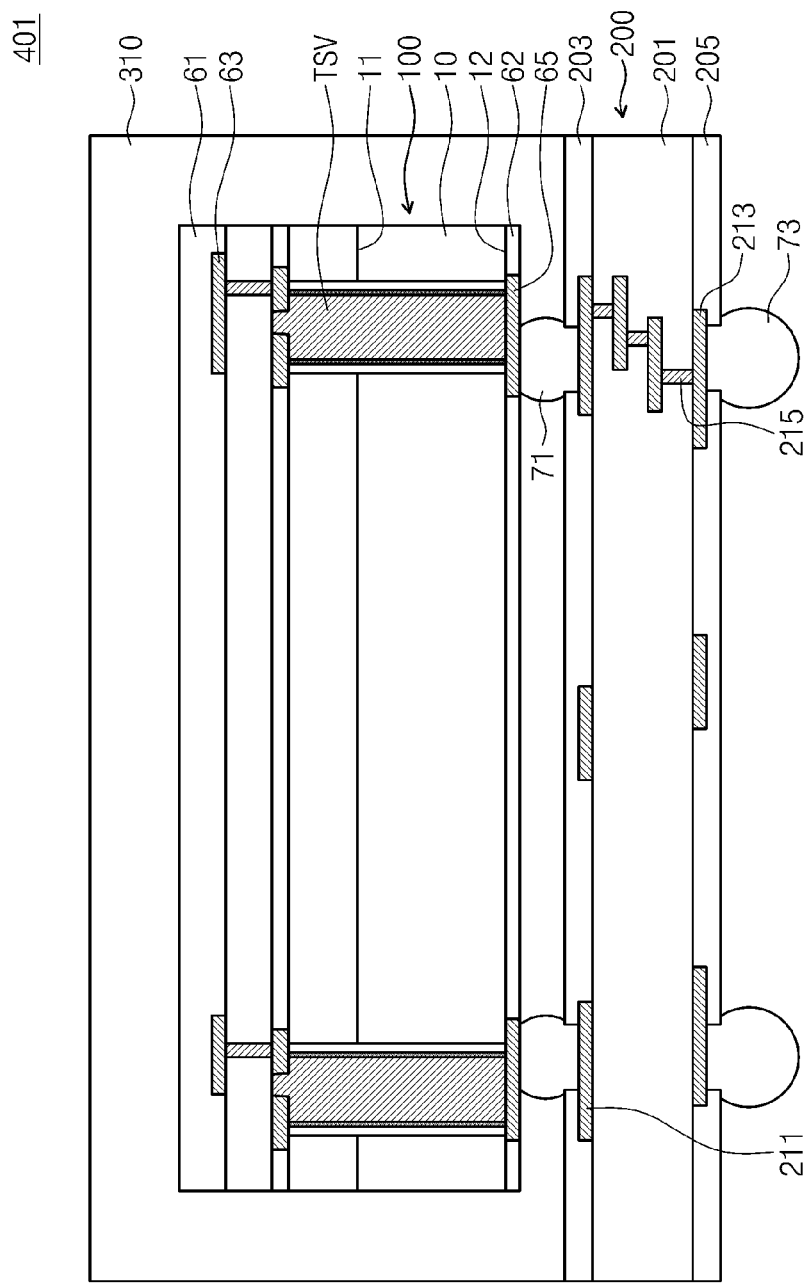
FIGS. 12 through 14 are sectional views illustrating semiconductor packages, according to example embodiments of the inventive concepts.
Figure 13:
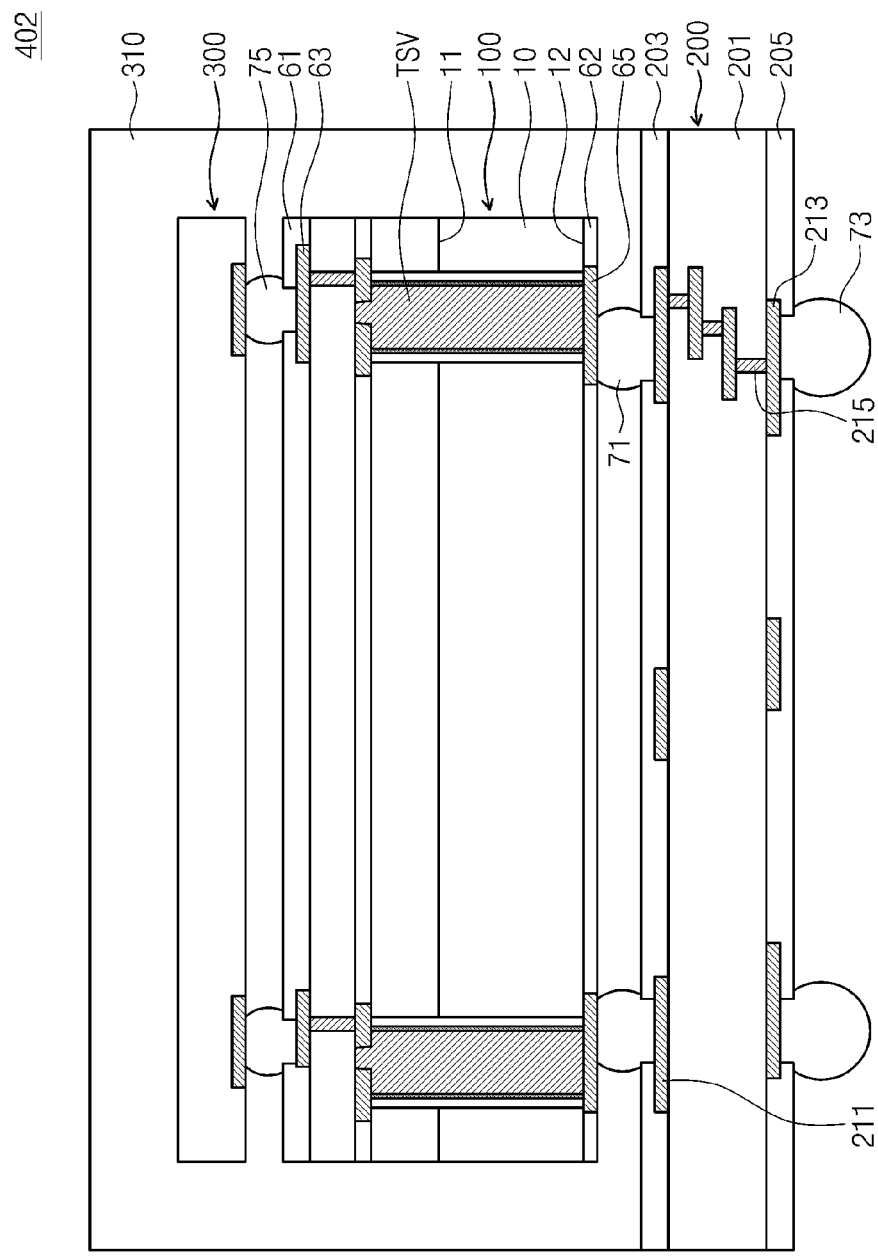
Figure 14:
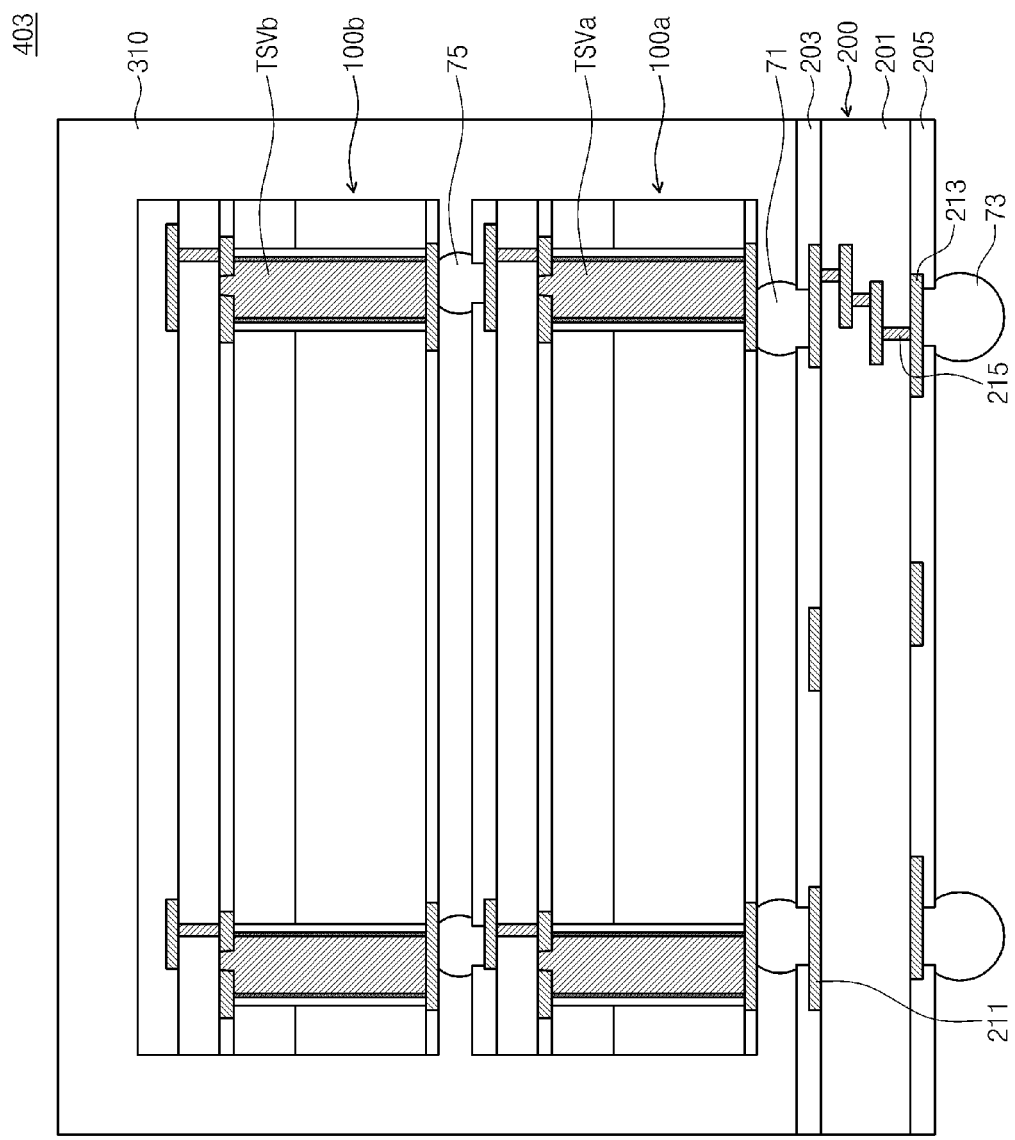

FIGS. 12 through 14 are sectional views illustrating semiconductor packages, according to example embodiments of the inventive concepts.

Referring to FIG. 12, a semiconductor package 401, according to an example embodiment of the inventive concepts, may include a package substrate 200 and a semiconductor device 100 mounted thereon. The package substrate 200 may be a printed circuit board. The package substrate 200 may include an insulating substrate 201, a redistributed line 215 provided in the insulating substrate 201, conductive patterns 211 and 213 provided on top and bottom surfaces, respectively, of the insulating substrate 201, and package-substrate insulating layers 205 and 203 partially covering the conductive patterns 211 and 213. In example embodiments, the semiconductor device 100 may be configured to have substantially the same features as those of one of the semiconductor devices described with reference to FIGS. 1 through 11.

The semiconductor device 100 may be mounted on the package substrate 200 in such a way that the second surface 12 of the substrate 10 faces the package substrate 200. The semiconductor device 100 may be electrically connected to the package substrate 200 via a first bump 71. A second bump 73 may be attached on a bottom surface of the package substrate 200. The bumps 71 and 73 may be a solder ball, a conductive bump, a conductive spacer, a pin grid array, or any combination thereof. The semiconductor package 401 may further include a mold layer 310 covering the semiconductor device 100. The mold layer 310 may include or be formed of an epoxy molding compound.

Referring to FIG. 13, a semiconductor package 402, according to another example embodiment of the inventive concepts, may include a first semiconductor device 100 and a second semiconductor device 300 that are mounted on the package substrate 200. The package substrate 200 may be a printed circuit board. The first semiconductor device 100 may be configured to have substantially the same features as those of one of the semiconductor devices described with reference to FIGS. 1 through 11. The second semiconductor device 300 may be a semiconductor device, e.g., a memory or logic chip, that is different from the first semiconductor device 100. In example embodiments, the second semiconductor device 300 may be configured not to include a through-silicon via.

The first semiconductor device 100 may be electrically connected to the package substrate 200 via the first bump 71. The second semiconductor device 300 may be mounted on the first semiconductor device 100 in a flip-chip bonding manner. The second semiconductor device 300 may be electrically connected to the first semiconductor device 100 via a third bump 75. The first semiconductor device 100 may be configured to serve as an interposer. In certain embodiments, a space between the third bumps 75 may be different from that between the through-silicon vias (TSVs).

The second bump 73 may be attached on a bottom surface of the package substrate 200. The bumps 71, 73, and 75 may be a solder ball, a conductive bump, a conductive spacer, a pin grid array, or any combination thereof. The semiconductor package 402 may further include the mold layer 310, which may be formed to cover the first and second semiconductor devices 100 and 300. The mold layer 310 may include or be formed of an epoxy molding compound.

Referring to FIG. 14, a semiconductor package 403, according to still another example embodiment of the inventive concepts, may include a first semiconductor device 100a and a second semiconductor device 100b that are mounted on the package substrate 200. The semiconductor package 403 may be configured to have the multi-chip package structure. The first semiconductor device 100a and the second semiconductor device 100b may be configured to be of the same kind and have the same structure.

The package substrate 200 may be a printed circuit board. Each of the first and second semiconductor devices 100a and 100b may be configured to have substantially the same features as those of one of the semiconductor devices described with reference to FIGS. 1 through 11.

The first and second semiconductor devices 100a and 100b may include a first through-silicon via TSVa and a second through-silicon via TSVb, respectively. The first through-silicon via TSVa and the second through-silicon via TSVb may be overlapped with each other in plan view. The first through-silicon via TSVa may be connected to the second through-silicon via TSVb through the third bump 75.

The first semiconductor device 100 may be electrically connected to the package substrate 200 via the first bump 71. The first semiconductor device 100 may be configured to serve as an interposer. The second bump 73 may be attached on a bottom surface of the package substrate 200. The bumps 71, 73, and 75 may be a solder ball, a conductive bump, a conductive spacer, a pin grid array, or any combination thereof. The semiconductor package 403 may further include the mold layer 310, which may be formed to cover the first and second semiconductor devices 100a and 100b. The mold layer 310 may include or be formed of an epoxy molding compound.

According to example embodiments of the inventive concepts described above, the packages may be electrically connected to the package substrate via the through-silicon via, but example embodiments of the inventive concepts may not be limited thereto. For example, some of the pads may be electrically connected to the package substrate by bonding wires.

Figure 15:
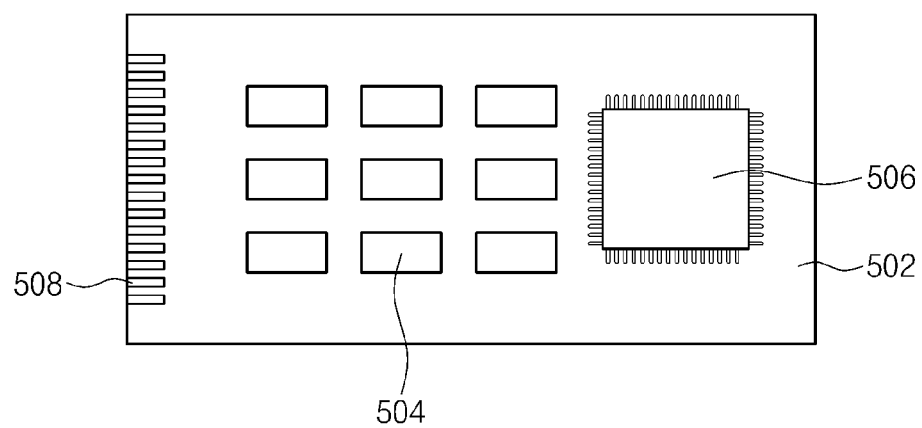
FIG. 15 is a plan view of a package module according to an example embodiment of the inventive concepts.

FIG. 15 is a plan view illustrating a package module according an example embodiment of the inventive concepts.

Referring to FIG. 15, a package module 500 may include a module substrate 502, which may be provided with at least one external connection terminal 508. The package module 500 may further include at least one semiconductor chip 504 and at least one semiconductor package 506, for example, a quad-flat-package (QFP) structure, mounted on the module substrate 502. The semiconductor chip 504 and/or the semiconductor package 506 may include one or more semiconductor devices according to embodiments of the inventive concepts. The package module 500 may be electrically connected to an external electronic device via the external connection terminal 508.

Figure 16:
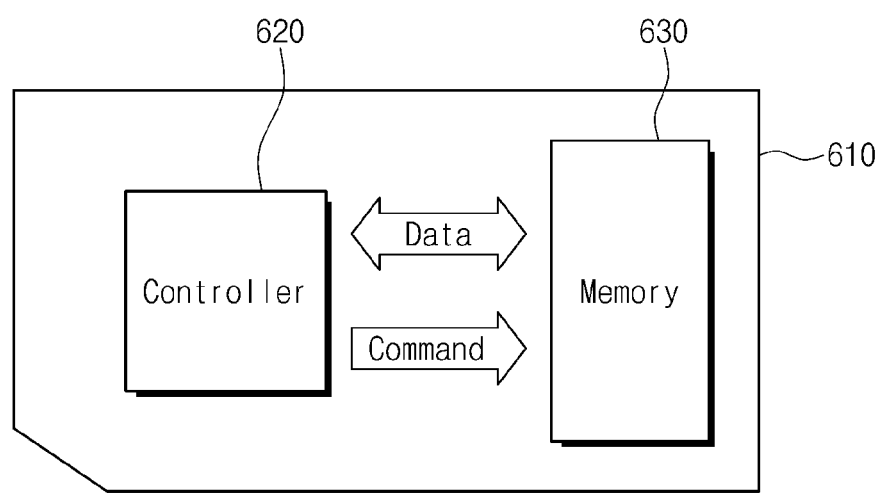
FIG. 16 is a schematic block diagram illustrating a memory card, according to an example embodiment of the inventive concepts.

FIG. 16 is a schematic block diagram illustrating a memory card in accordance with an example embodiment of the inventive concepts.

Referring to FIG. 16, a memory card 600 may include a controller 620 and a memory 630 in a housing 610. The controller 620 and the memory 630 may exchange an electric signal with each other. For example, the memory 630 and the controller 620 may exchange data with each other according to a command provided by the controller 620. Thus, the memory card 600 may store data in the memory 630 or may output data from the memory 630.

The controller 620 and/or the memory 630 may include at least one of the semiconductor devices or the semiconductor packages in accordance with embodiments of the inventive concepts, for example, described herein. The memory card 600 may be used as a data storage medium for various portable devices. For example, the memory card 600 may include a multi media card (MMC) or a secure digital (SD) card.

Figure 17:
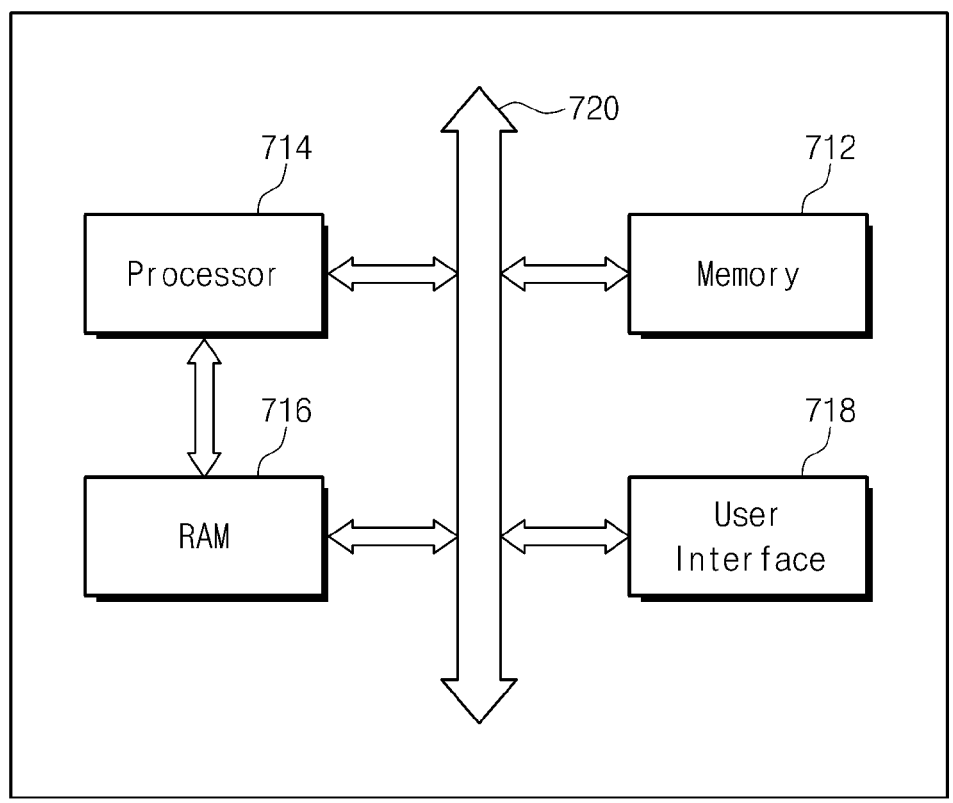
FIG. 17 is a schematic block diagram illustrating an electronic system, according to an example embodiment of the inventive concepts.

FIG. 17 is a block diagram illustrating an electronic system in accordance with an example embodiment of the inventive concepts.

Referring to FIG. 17, an electronic system 700 may include at least one of the semiconductor devices or the semiconductor packages in accordance with an example embodiment of the inventive concepts, for example, described herein. The electronic system 700 may include a mobile device or a computer. For example, the electronic system 700 may include a memory system 712, a processor 714, a random access memory (RAM) 716, and a user interface 718 that can exchange data with one another using a bus 720. The processor 714 may execute a program and/or control the electronic system 700. The RAM 716 may be used as an operation memory of the processor 714. For example, the processor 714 and the RAM 716 may include a semiconductor device or the semiconductor packages in accordance with example embodiments of the inventive concepts. The processor 714 and the RAM 716 may be included in one package. The user interface 718 may be used to input data in the electronic system 700 or to output data from the electronic system 700. The memory system 712 may store program code for performing an operation of the processor 714, data processed by the processor 714, and/or data input from an external source. The memory system 712 may include a controller and a memory, and may be the same as or similar to the memory card 600 of FIG. 16.

Figure 18:
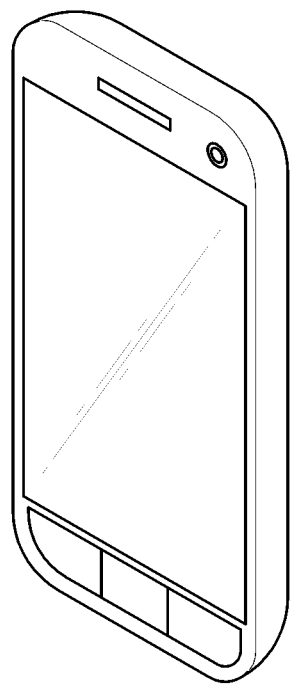
FIG. 18 shows a mobile device, which is presented as an example of the electronic system of FIG. 17.

The electronic system 700 may be applied to various electronic devices. For example, as shown in FIG. 18, the electronic system 700 can be applied to a mobile phone 800. According to other example embodiments, the electronic system 700 may be applied to a portable notebook, a MP3 player, a navigation system, a solid state disk (SSD), a vehicle, or home appliances.

According to example embodiments of the inventive concepts, it is possible to suppress characteristics of the integrated circuit from being changed by a thermal treatment process. In addition, the through-silicon via can be prevented from being extruded in a subsequent process, and thus, it is possible to prevent an interlayered dielectric layer on the through-silicon via from being cracked and to prevent the through-silicon via from being detached from an interconnection line thereon. This makes it possible to reduce a contact resistance of the device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate having a first surface and a second surface facing each other;
a through-silicon via provided in a via hole penetrating the substrate;

an integrated circuit spaced apart from the through-silicon via, the integrated circuit being on the first surface of the substrate;

a first pad connected to the through-silicon via, the first pad being on the first surface of the substrate; and a second pad connected to the through-silicon via, the second pad being on the second surface of the substrate, wherein the through-silicon via includes a first conductive pattern filling the via hole, and a protrusion extending from the first conductive pattern into the first pad, the first pad includes a recess region extending from a bottom surface of the first pad toward a top surface of the first pad, the protrusion is in contact with the recess region of the first pad, and the protrusion has a top surface coplanar with the top surface of the first pad.

2. The device of claim 1, wherein the first pad is in contact with the protrusion.

3. The device of claim 1, wherein a width of the recess region decreases with increasing distance from the bottom surface of the first pad.

4. The device of claim 1, further comprising:
an interlayered dielectric layer on the first surface of the substrate to cover the integrated circuit,
wherein the via hole penetrates the interlayered dielectric layer, and
the first pad is on the interlayered dielectric layer.

5. The device of claim 1, wherein,
the recess region extends to the top surface of the first pad.

* * * * *